(12) United States Patent
Kahen

(10) Patent No.: US 7,494,903 B2
(45) Date of Patent: Feb. 24, 2009

(54) DOPED NANOPARTICLE SEMICONDUCTOR CHARGE TRANSPORT LAYER

(75) Inventor: Keith B. Kahen, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 18 days.

(21) Appl. No.: 11/668,041

(22) Filed: Jan. 29, 2007

(65) Prior Publication Data

US 2008/0182391 A1 Jul. 31, 2008

(51) Int. Cl.
 *H01L 21/00* (2006.01)
(52) U.S. Cl. ............... 438/499; 438/492; 438/502; 977/892; 117/56; 257/E21.114; 257/E21.12; 257/E21.132; 257/E21.133
(58) Field of Classification Search ........... 438/499, 438/492, 502; 977/892; 257/E21.114, E21.12, 257/E21.132, E21.133; 117/56
See application file for complete search history.

(56) References Cited

U.S. PATENT DOCUMENTS

| 7,087,832 B2 | 8/2006 | Scher et al. | |
| 7,294,449 B1 * | 11/2007 | Gudeman et al. | 430/270.1 |
| 2007/0202333 A1 * | 8/2007 | O'Brien et al. | 428/402 |

OTHER PUBLICATIONS

Narayan et al., Colloidal CdSe Quantum Wires by Oriented Attachment, Nano Letters, vol. 6, No. 4, 2006, pp. 720-724.*
Tang et al, Organic electroluminescent diodes, Appl. Phys. Lett. 51, 913-915 (1987).
Tang et al, Spontaneous Organization of Single CdTe Nanoparticles into Luminescent Nanowires, Science, Vo. 297, Jul. 12, 2005, pp. 237-240.
Pradham et al, Colloidal CdSe Quantum Wires by Oriented Attachment, Nano Letters, V01. 6, No. 4, pp. 720-724, 2006.
Pena et al, Template Growth of Photoconductive Metal-CdSe-Metal Nanowires, J. Phys. Chem. B2002, 106, pp. 7458-7462.
Murray et al, Synthesis and Characterization of Nearly Monodisperse CdE (E=S, Se, Te) Semiconductor Nanocrystallites, J. Am Chem, 1993, 115 pp. 8706 -8715.
Liu et al, Employing End-Functional Polythiophene to Control the Morphology of Nanocrystal-Polymer Composites in Hybrid Solar Cells, J. Am. Chem. Soc. 2004, 126, pp. 6550-6551.
Huang et al, Low voltage organic electroluminescent devices using pin structures, App. Phys. Lett. V.80, No. 1, Jan. 2002, pp. 139-141.
Gur et al, Air Stable All Inorganic Nanocrystal Solar Cells Processed From Solution, Science, Vo. 310, Oct. 2005, 462-465.
Erwin et al, Doping semiconductor nanocrystals, Nature Letters, V43617, Jul. 2005, pp. 91-94.
Dhere et al, Thin-film photovoltaics, J. Vac. Sci. Tech. A23(4) Jul./Aug. 2005, pp. 1208-1214.
Yu et al n-Type Conducting CdSe Nanocrystal Solids, Science, vol. 300, May 2003, pp. 1277-1280.
Yu et al, Cadmium Selenide Quantum Wires and the Transition from 3D to 2D Confinement, J. Am. Chem. Soc. 2003, 125, pp. 16268-16169.
C. B. Murray et al., Synthesis and Characterization of Monodisperse Nanocrystals and Close-Packed Nanocrystal Assemblies, Annu. Rev. Mater. Sci. 30, 545-593 (2000).
A. N. Goldstein et al., Melting in Semiconductor Nanocrystals, Science 256, 1425-1426 (1992).
K. B. Kahen, Rigorous optical modeling of multilayer organic light-emitting diode devices, Appl. Phys. Lett. 78, 1649-1651 (2001).
P. J. George et al., Doping of chemically deposited intrinsic CdS thin films to n type by thermal diffusion of indium, Appl. Phys. Lett. 66, 3624-3626 [1995].

* cited by examiner

*Primary Examiner*—George Fourson
*Assistant Examiner*—Julio J. Maldonado
(74) *Attorney, Agent, or Firm*—Raymond L. Owens

(57) ABSTRACT

A method is disclosed for making a doped semiconductor transport layer for use in an electronic device comprising: growing in-situ doped semiconductor nanoparticles in a colloidal solution; depositing the in-situ doped semiconductor nanoparticles on a surface; and annealing the deposited in-situ doped semiconductor nanoparticles so that the organic ligands boil off the surface of the in-situ doped semiconductor nanoparticles.

18 Claims, 6 Drawing Sheets

US 7,494,903 B2

DOPED NANOPARTICLE SEMICONDUCTOR CHARGE TRANSPORT LAYER

FIELD OF THE INVENTION

The present invention relates to inorganic semiconductor devices that include charge transport layers composed of inorganic nanoparticles.

BACKGROUND OF THE INVENTION

Charge transport layers containing n-type or p-type semiconductors can be used in making a variety of devices such as field effect transistors, bipolar transistors, p-n diodes, light emitting diodes (LEDs), lasers, sensors, solar cells and others. Most semiconductor devices in use today, both inorganic and organic, are in part or completely formed using expensive vacuum deposition processes. There are ongoing efforts to find a low cost manufacturing process, but to date, device performance has been inadequate for market needs. Therefore, there is a need for a low cost technique of forming high quality inorganic charge transport layers for use in semiconductor devices.

In general, both n-type and p-type materials can be referred to as charge transport materials, and the layers of a device containing such materials can be referred to as charge transport layers. An n-type material typically has an excess of conduction band electrons, and as such is also referred to as an electron transport material. Furthermore, an n-type semiconductor is a semiconductor in which electrical conduction is due chiefly to the movement of electrons. A p-type material typically has an excess of "holes", and as such is also referred to as a hole transport material. Furthermore, a p-type semiconductor is a semiconductor in which electrical conduction is due chiefly to the movement of positive holes. The doping levels of the charge transport layers are typically set so that they are highest when the layers are in contact with metals (in order to assist in forming ohmic contacts). For the case of the layers being in contact with the anode or cathode, the charge transport layers are also typically called contact layers.

Semiconductor diode devices have been in use since the late 1800s. Most modern diode technologies are based on semiconductor p-n junctions, or contact between p-type and n-type semiconductors. However, many types of electronics would benefit from lower cost charge transport layers. Therefore, multiple types of junctions may be formed using the charge transport layers of this invention. For example, in addition to the p/n junction, the junction could be a p/p junction, an n/n junction, a p/i junction (where i refers to an intrinsic semiconductor), an n/i junction, an i/i junction, or the like. A junction may also be a semiconductor/semiconductor junction, a semiconductor/metal junction (a Schottky junction), or a semiconductor/insulator junction. The junction may also be a junction of two different semiconductor materials (a heterojunction), a doped semiconductor to a doped or an undoped semiconductor, or a junction between regions having different dopant concentrations. The junction may also be a defected region to a perfect single crystal, an amorphous region to a crystal, a crystal to another crystal, an amorphous region to another amorphous region, a defected region to another defected region, an amorphous region to a defected region, or the like.

In the field of photovoltaic devices, current devices employ thin layers of semiconductor material, e.g., crystalline silicon, gallium arsenide, or the like, incorporating a p-n junction to convert solar energy to direct current. While these devices are useful in certain applications, their efficiency has been somewhat limited, yielding conversion efficiencies, e.g., solar power to electrical power, of typically marginally better than 10-20%. Although efficiencies of these devices have been improving through costly improvements to device structure, the relative inefficiency of these devices, combined with their relatively high cost, have combined to inhibit the widespread adoption of solar electricity in the consumer markets. Instead, such systems have been primarily used where conventionally generated electricity is unavailable, or where costs associated with bringing conventionally generated electricity, to a location where it is needed, more closely match the costs of photovoltaic systems.

Despite the issues with current photovoltaic technology, there is still a desire and a need to expand usage of solar electricity. In particular, there is generally a need for an improved photovoltaic cell that has one or more of: increased energy conversion efficiency, decreased manufacturing costs, greater flexibility and/or reasonable durability and/or longevity. In fact, as disclosed in U.S. Pat. No. 7,087,832 Scher et al. disclose the use of coatable nanoparticles in a polymer binder for use in photovoltaic devices. However, the performance of these devices were not reported, and the conductivity of such a mixed photoactive layer is expected to be low due to the high resistivity of the polymeric binder. An example of the performance of devices with these hybrid absorber layers is an efficiency of ~1.5% under AM 1.5 excitation (J. Liu et al., JACS 126, 6550 (2004)). Recently, an all inorganic solution processed solar cell was formed from CdSe and CdTe quantum rod nanoparticles, but again the efficiency was very low at 3% even after sintering the films at 400° C. for 15 minutes (I. Gur et. al, Science 310, 462 (2005)). A large part of the low efficiency was undoubtedly due to the films being insulators (even after sintering) due to the lack of doping. For both CdTe and $CuIn_{1-x}Ga_xSe_{2-y}S$ (CIGSS) solar cells, the window layer is typically n-CdS (N. G. Dhere et al., J. Vac. Sci. Technol. A23, 1208 (2005)). Both doped and undoped forms of CdS have been used in the devices and a preferred deposition technique has been chemical bath deposition (CBD). Even though a solution processed technique, CBD involves dunking the entire wafer into a bath, which can be acidic or basic, for periods up to hours. In addition, the process is inefficient with respect to usage of its starting materials.

FIG. 1 gives a schematic of a typical prior art LED device 105 that incorporates charge transport layers. All of the device layers are deposited on a substrate 100. Above the substrate 100 are a p-contact layer 110, a p-transport layer 120, an intrinsic emitter layer 130, a n-transport layer 140, and a n-contact layer 150. An anode 160 makes ohmic contact with the p-contact layer 110, while a cathode 170 makes ohmic contact with the n-contact layer 150. As is well-known in the art, LED structures typically contain doped n- and p-type transport layers, and more heavily doped n- and p-type contact layers. They serve a few different purposes. Forming ohmic contacts to semiconductors is simpler if the semiconductors are doped. Since the emitter layer is typically intrinsic or lightly doped, it is much simpler to make ohmic contacts to the doped transport layers. As a result of surface plasmon effects (K. B. Kahen, Appl. Phys. Lett. 78, 1649 (2001)), having metal layers adjacent to emitter layers results in a loss emitter efficiency. Consequently, it is advantageous to space the emitter layers from the metal contacts by sufficiently thick (at least 150 nm) transport layers. Next it is advantageous to employ transport layers that not only can easily inject charge into the emitter layer, but also prevent the carriers from leaking back out of the emitter layer. As a consequence, the transport layers will have the largest bandgaps of the device layers. As is well known in the art, highly doping wide bandgap semiconductors is difficult as a result of self-compensation effects. Consequently, forming ohmic contacts to these layers can prove to be difficult. As a result, it is adventitious to add contact layers to the device whose bandgap is smaller than that of the transport layers. Beyond these advantages, doping the transport layers also reduces ohmic heating effects (which can be highly important for laser devices) and leads to larger separations of the n- and p-quasi Fermi levels (which also aids laser, pin diode, and photovoltaic devices). The above discussion illustrates that having the ability to create doped transport layers results in numerous advantages for many semiconductor electronic devices.

LED devices have been made since the early 1960's and currently are manufactured for usage in a wide range of consumer and commercial applications. The layers comprising the LEDs are conventionally based on crystalline semiconductor materials that require ultra-high vacuum techniques for their growth, such as, molecular organic chemical vapor deposition (MOCVD). In addition, the layers typically need to be grown on nearly lattice-matched substrates in order to form defect-free layers. These crystalline-based inorganic LEDs have the advantages of high brightness (due to layers with high conductivities), long lifetimes, good environmental stability, and good external quantum efficiencies. The high conductivities of the transport layers result from high mobilities (due to the crystalline nature of the films) and the ability to readily dope crystalline layers with donors and acceptors. The usage of crystalline semiconductor layers that results in all of these advantages, also leads to a number of disadvantages. The dominant ones are high manufacturing costs, difficulty in combining multi-color output from the same chip, and the need for high cost and rigid substrates.

A way for forming low cost LEDs began in the 1980's with the introduction of organic light emitting diodes (OLED) (Tang et al., Appl. Phys. Lett. 51, 913 (1987)). The transport layers for these devices are highly resistive ($10^8$ ohm-cm) in comparison with those used in crystalline LEDs. Recent attempts at doping these layers (J. Huang et al., Appl. Phys. Lett. 80, 139 (2002)) have resulted in layer resistivities in the $10^4$-$10^6$ ohm-cm range. However, many of these dopants are unstable and the resistivities are many orders of magnitude higher than crystalline LED values of ~0.1 ohm-cm. The result of employing resistive layers is that one suffers from ohmic heating effects; it is difficult to make ohmic contacts; and since the drive current of the device is limited, so is the overall brightness of the device.

The above examples illustrate that higher performance semiconductor devices can be created from crystalline semiconductor materials; but with the drawback of high manufacturing costs. Attempts to reduce the manufacturing costs by employing organic materials result in lower performance devices whose specs sometimes fall significantly short of market requirements (e.g., organic-based photovoltaics). Two approaches to lower the cost of crystalline semiconductor materials are to employ either amorphous or polycrystalline inorganic semiconductor materials; however, both of these approaches have well-known drawbacks. Taking the case of devices formed from amorphous Si, both thin-film transistor and photovoltaic (PV) devices have significantly reduced performance due to low mobilities (and the Staebler-Wronski effect for PVs). The performance of polycrystalline-based devices is improved with devices being formed from processes, such as, sputtering and CBD. However, sputtering is a higher cost, vacuum-based deposition process and CBD, though chemically based, has long deposition times and is inefficient in its usage of starting materials, as stated previously.

The newest way for creating low cost semiconductor devices is to form the layers from inorganic semiconductor nanoparticles. To obtain the full advantage of these crystalline particles for usage in semiconductor transport layers, the nanoparticles should both be doped (to increase their intrinsic carrier concentration) and devoid of organic ligands on their surface (which impede charge transport). In spite of a plethora of reports about doping nanoparticles to modify their emission and magnetic characteristics (S. C. Erwin et al., Nature 436, 91 (2005)), there has been very limited research devoted to modifying the nanoparticle's carrier concentration (D. Yu et al., Science 300, 1277 (2003)). In the work of Yu et al. (D. Yu et al., Science 300, 1277 (2003)), even though they doped nanoparticle films, it was done by adding potassium through a high vacuum, post deposition, vacuum evaporation process. In general, even if nanoparticles are stripped of their insulating organic ligands by an annealing process, without added impurities atoms to modify the donor or acceptor concentrations, the resulting nanoparticles have limited conductivities (I. Gur et. al., Science 310, 462 (2005)).

SUMMARY OF THE INVENTION

The present invention modifies the donor or acceptor concentration of a nanoparticle by an appropriate doping scheme. The resulting nanoparticle, when incorporated into a semiconductor transport layer, shows enhanced electron or hole conductivity. Combining the ability to the dope the nanoparticle with the inherent low cost characteristics of nanoparticle-based electronics, results in low cost inorganic semiconductor devices having performance characteristics indicative of doped polycrystalline-based devices.

It is an object of this invention to provide an inorganic semiconductor device whose charge transport layer is formed from doped inorganic nanoparticles. This object is achieved by the method of making a doped semiconductor transport layer for use in an electronic device comprising:

(a) growing in-situ doped semiconductor nanoparticles in a colloidal solution;

(b) depositing the in-situ doped semiconductor nanoparticles on a surface; and (c) annealing the deposited in-situ doped semiconductor nanoparticles so that the organic ligands boil off the surface of the in-situ doped semiconductor nanoparticles.

It is an advantage of the present invention to enable a simple method of forming doped semiconductor nanoparticles. The semiconductor nanoparticles are doped in-situ with dopant materials during the process of synthetic growth of the colloidal nanoparticles. Inorganic device layers composed of inorganic nanoparticles are typically highly resistive, which limits the usefulness of these devices despite their low cost. By incorporating in-situ doped inorganic nanoparticles into the transport layers of devices, one can produce the devices at low cost while still maintaining good device performance. In addition, separate thermal anneal steps are used to reduce the resistivities of the charge transport layers. Doped transport layers help device performance by increasing the separation of the n- and p-quasi Fermi levels, reduce ohmic heating, and aide in forming ohmic contacts. By forming the transport layers from in-situ doped inorganic nanoparticles, the device layers can be deposited by low cost processes, such as, drop casting, spin coating, or inkjetting. The resulting nanoparticle-based device can also be formed on a range of substrates.

DETAILED DESCRIPTION OF THE INVENTION

Figure 1:
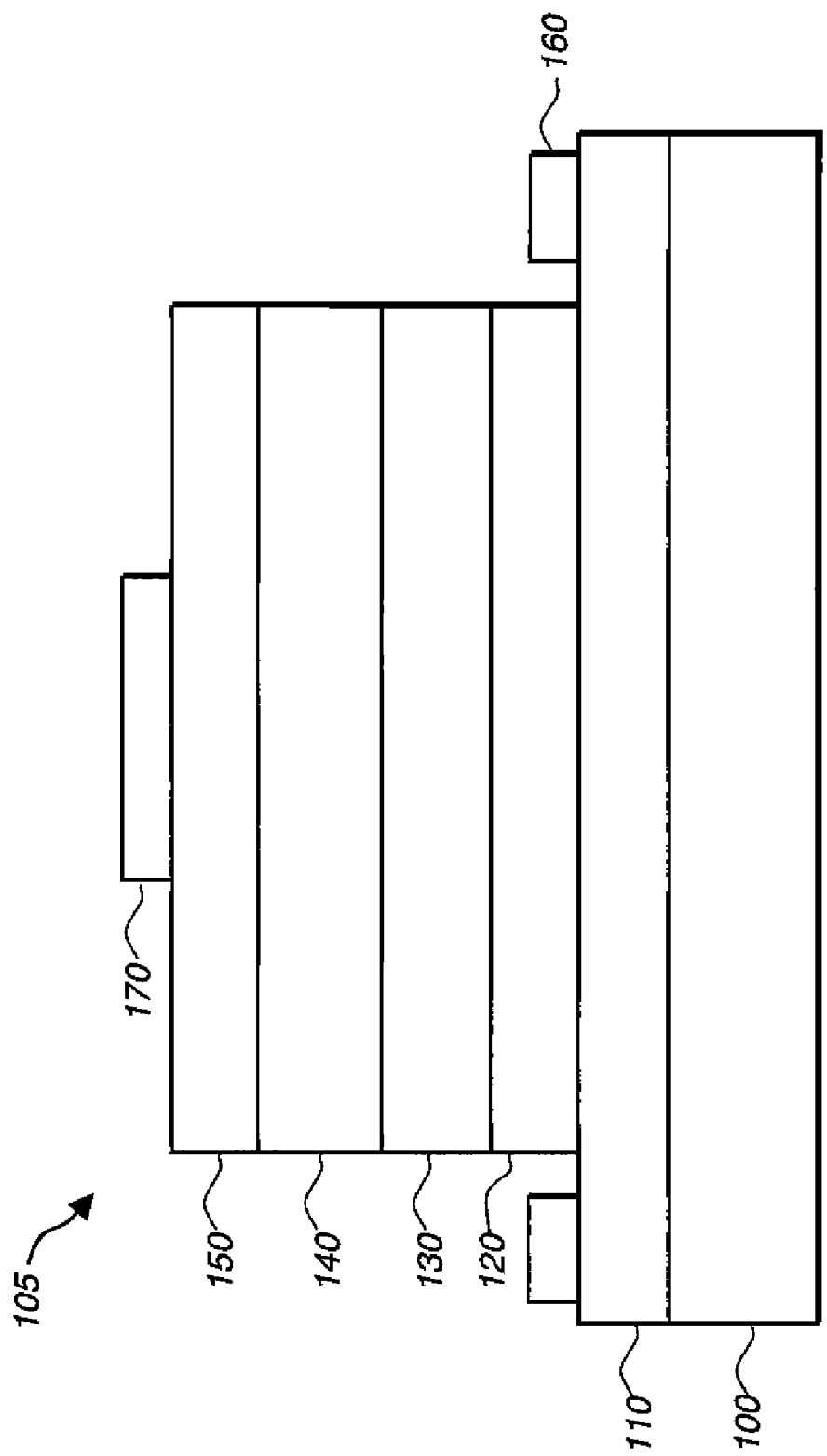
FIG. 1 shows a side-view schematic of a prior art inorganic light emitting device.
Figure 2:
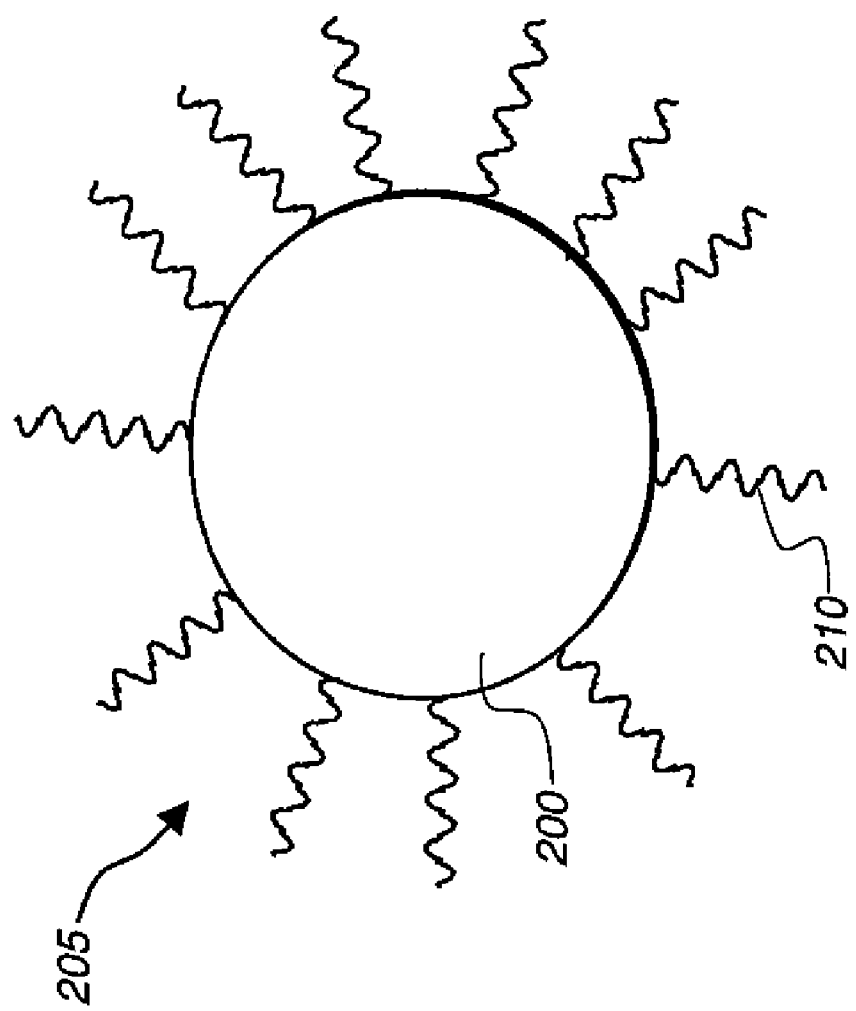
FIG. 2 shows a schematic of a colloidal inorganic nanoparticle.

It is desirable to form devices that not only have good performance, but also are low cost and can be deposited on arbitrary substrates. Using colloidal-based nanoparticles as the building blocks for semiconductor electronic devices would result in devices that confer these advantages as long as the layers can be properly doped. A typical colloidal inorganic nanoparticle 205 is shown in FIG. 2. In the figure, the inorganic nanoparticle 205 is composed of a semiconductor core 200, on whose surface is bonded organic ligands 210. The organic ligands 210 give stability to the resulting colloidal dispersion (the inorganic nanoparticle 205 and an appropriate solvent). Even though the inorganic nanoparticle 205 shown in FIG. 2 is spherical in shape, nanoparticles can be synthesized to be shapes ranging from quantum rods and wires, to tetrapods and other multiply connected nanoparticles that show quantum confinement effects.

Semiconductor films can be doped by a number of ways. Some of these are extrinsic processes, namely, the doping occurs after the materials comprising the layer have been grown or synthesized. For example, extrinsic donors and acceptors can be introduced into a layer by ion implantation and by diffusion processes (P. J. George et al., Appl. Phys. Lett. 66, 3624 (1995)). For the diffusion processes, the source for the dopant materials can be a solid source (metal on the layer surface), a liquid source (containing appropriate metal ions), and a vapor source (e.g., closed tube diffusions containing a subliming metallic source). Even though the semiconductor industry has a long history of implementing these extrinsic doping procedures, they involve extra processing steps, such as, removing the solid diffusion source once the diffusion process is complete. Another way for generating donors and acceptors is by creation of native defects. In compound semiconductors they can be generated by annealing the layers under appropriate overpressure conditions. In general this method is not preferred. The preferred doping approach is called in-situ doping that occurs when donors or acceptors are introduced into the materials during their synthesis. For crystalline semiconductors, in-situ doping has been highly successful, especially using the ultra high vacuum processes such as MOCVD and molecular beam epitaxy (MBE).

Adapting in-situ doping to inorganic nanoparticles 205 has a number of challenging issues associated with it. Foremost is the problem that doping levels are typically in the 1 part in $10^4$-$10^5$ range, while a 4 nm spherical nanoparticle only contains on the order of 1000 atoms (C. B. Murray et al., JACS 115, 8706 (1993)). As a result, many of the nanoparticles would not contain a dopant atom 310. This situation causes problems since if a large fraction of the nanoparticles are undoped, then these nanoparticles would be highly resistive which would result in the device layer being highly resistive. The only way to resolve this problem is to sinter the nanoparticles together to such a degree that the individuality of the separate nanoparticles is removed. Another issue is that incorporating impurity atoms in nanoparticles was shown to be difficult for certain crystal structures (S. C. Erwin et al., Nature 436, 91 (2005)), such as, zinc blende.

Figure 3:
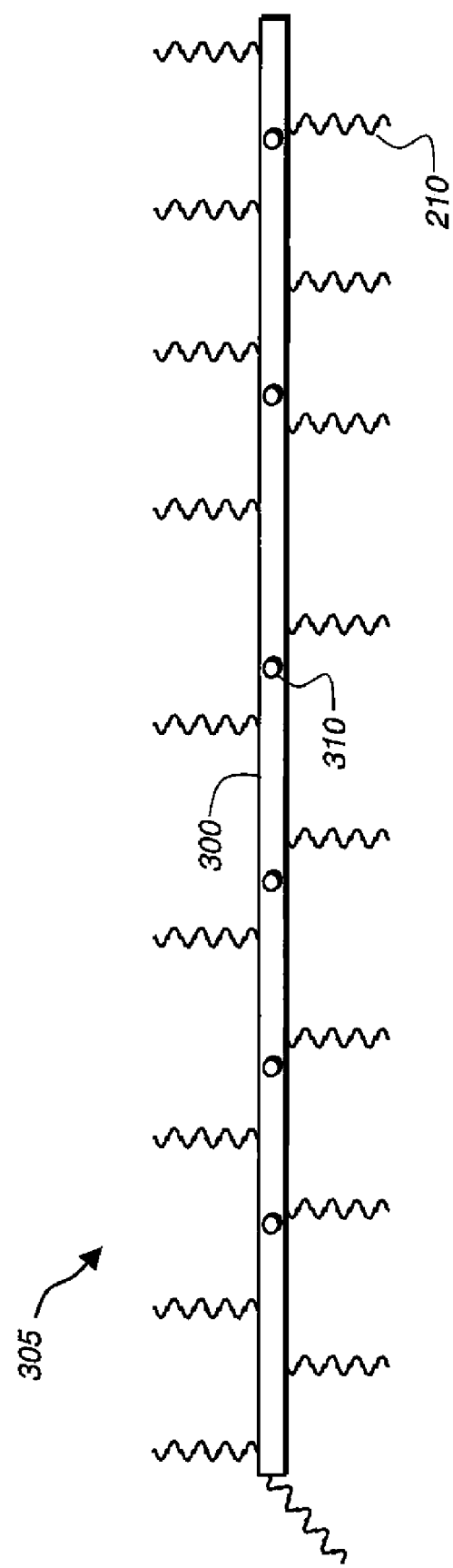
FIG. 3 shows a schematic of an in-situ doped quantum wire nanoparticle.

Our strategy for dealing with these issues was to use quantum wires 300 as the doping platform (see FIG. 3). Quantum wires 300 have diameters of 1-10 nm, with lengths up to 1-2 μm. Taking the case of a quantum wire 300 with a diameter of 3 nm and a length of 1 μm, it would contain ~3×$10^5$ atoms. Given the typical doping levels discussed above, this implies that each quantum wire 300 would contain many impurity atoms and, thus, would show reasonable conductance properties. With regard to the crystal structure question, quantum wires 300 of many compound semiconductors display the wurtzite structure (N. Pradhan et al., Nano Letters 6, 720 (2006)), despite the corresponding dots (e.g., CdSe) having the zinc blende structure.

Colloidal quantum wires 300 can be grown by a few different processes. Quantum wires 300 with larger diameters can be grown by the solution-liquid-solid method (H. Yu et al., JACS 125, 16168 (2003)) and the nanoporous template methods (D. J. Pena et al., J. Phys. Chem. B106, 7558 (2002)). Colloidal quantum wires 300 with smaller diameters (which are preferred because they can be fused at lower temperatures) can be grown by the oriented attachment approach. This approach is so named since it refers to the phenomenon that generates quantum wires 300 by attaching existing spherical shaped nanoparticles along a given crystallographic direction. The nanoparticles which attach can either be pregrown in a separate reaction (Z. Tang et al., Science 297, 237 (2002)) or grown during the oriented attachment process (N. Pradhan et al., Nano Letters 6, 720 (2006)).

In order to form in-situ doped semiconductor nanoparticles 305 we'll take the example of the semiconductor being a II-VI compound. Doping these with column III elements, such as, Al, Ga, and In, results in n-type doping of the II-VI semiconductors. In choosing an appropriate chemical precursor for the n-type dopant atoms 310, it is preferred that it be matched to the reactivity of the cation precursor. For example, if the cation is Cd and its precursor is cadmium acetate, then a properly matched dopant atom 310 precursor would be indium acetate. In our experiments to date the dopant atom 310 precursors were added simultaneously with the cation precursor; however, as is well known in the art, the dopant atom 310 precursors could also be added at intervals during the quantum wire 300 growth process or dripped in continuously. It should be noted that choosing cation and dopant atom 310 precursors with different reactivities could also be successfully implemented. The three other cases for substitutional dopants are acceptors replacing the cations (e.g., Li for II-VI compounds), donors replacing the anions (e.g., Cl for II-VI compounds) and acceptors replacing the anions (e.g., N for II-VI compounds). In each of these three cases, analogous considerations hold between the reactivities of the dopant precursors and the reactivities of the cation/anion precursors. Lastly, the inorganic nanoparticle 205 can be other species besides quantum wires 300 as long as their atomic size is such that on average they contain more than dopant species per nanoparticle. Possible nanoparticle species would be branched nanocrystals and other multiply connected nanoparticles that show quantum confinement effects.

In general the material composing the doped charge transport layer can be selected from type II-VI, III-V, IV-VI, or IV semiconductor materials. Specific type IV semiconductors are Si, Ge, and Sn. Specific type III-V semiconductors are AlN, AlP, AlAs, and AlSb; GaN, GaP, GaAs, and GaSb; and InN, InP, InAs, and InSb. Specific II-VI semiconductors are ZnS, ZnSe, and ZnTe; CdS, CdSe, and CdTe, HgS, HgSe, and HgTe. Specific IV-VI semiconductors are PbS, PbSe, and PbTe. These various semiconductor materials can be doped by the following materials. For type IV semiconductors, the dopant atoms 310 can be selected from group III or V materials. For type III-V semiconductors, the dopant atoms 310 can be selected from group IIa, IIb, IV, or VI materials. For type II-VI semiconductors, the dopant atoms 310 can be selected from group Ia, Ib, III, V, or VII materials. For type IV-VI semiconductors, the dopant atoms 310 can be selected from group III, V, or VII materials.

Having grown the in-situ doped semiconductor nanoparticles 305, it is then necessary to create a doped semiconductor transport layer composed of them. As is well known in the art, three low cost techniques for forming nanoparticle films are depositing the colloidal dispersion of in-situ doped semiconductor nanoparticles 305 by drop casting, spin coating and inkjetting. Common solvents for drop casting in-situ doped semiconductor nanoparticles 305 are a 9:1 mixture of hexane:octane (C. B. Murray et al., Annu. Rev. Mater. Sci. 30, 545 (2000)). The organic ligands 210 need to be chosen such that the in-situ doped semiconductor nanoparticles 305 are soluble in non-polar solvents. As such, organic ligands with hydrocarbon-based tails are good choices, such as, the alkylamines. Using well-known procedures in the art, the ligands coming from the growth procedure (trioctylphosphine oxide, for example) can be exchanged for the organic ligand 210 of choice (C. B. Murray et al., Annu. Rev. Mater. Sci. 30, 545 (2000)). When spin coating a colloidal dispersion of in-situ doped semiconductor nanoparticles 305, the requirements of the solvents are that they easily spread on the deposition surface and the solvents evaporate at a moderate rate during the spinning process. It was found that alcohol-based polar solvents are a good choice; for example, combining a low boiling point alcohol, such as, ethanol, with higher boiling point alcohols, such as, a butanol-hexanol mixture or 1-propanol, results in good film formation. Correspondingly, ligand exchange can be used to attach an organic ligand 210 (to the in-situ doped semiconductor nanoparticles 305) whose tail is soluble in polar solvents; pyridine is an example of a suitable ligand. The doped semiconductor transport layers resulting from these three deposition processes are resistive since non-conductive organic ligands 210 separate the in-situ doped semiconductor nanoparticles 305. In order to enhance the conductivity of the doped semiconductor transport layer, it is preferred that the organic ligands 210 attached to the in-situ doped semiconductor nanoparticles 305 evaporate as a result of annealing the doped semiconductor transport layer in an inert atmosphere. By choosing the organic ligands 210 to have a low boiling point (less than 200° C.), they can be made to evaporate from the film during an annealing process (C. B. Murray et al., Annu. Rev. Mater. Sci. 30, 545 (2000)) where the anneal temperature is below 220° C. Consequently, for films formed by drop casting with non-polar solvents, shorter chained primary amines, such as, hexylamine are preferred; for films formed by spin coating with polar solvents, pyridine is a preferred ligand.

Following the anneal step to boil off the organic ligands 210, the doped semiconductor transport layer remains resistive since there is poor connectivity between the in-situ doped semiconductor nanoparticles 305 and electron and holes can get trapped by the nanoparticle's surface states. The issue of poor connectivity is alleviated by using the result that nanoparticles melt at much reduced temperatures compared to their bulk counterparts (A. N. Goldstein et al., Science 256, 1425 (1992)). Consequently, it is desirable that the in-situ doped semiconductor nanoparticles 305 have diameters less than 5 nm in order to enhance the sintering process, with a preferred size of 1-3 nm. Typical annealing temperatures are between 250 and 500° C. The annealing can take place in either a tube furnace or a rapid thermal annealer, where a variety of gases (such as, nitrogen, argon, oxygen, hydrogen, or forming gas) can be used depending on the desired outcome. As is well known in the art, other heating apparatus can also be used to anneal the doped semiconductor transport layer. The trapping by surface states is also partially alleviated by the sintering process; however, many surface states remain after typical anneals.

The following example is presented as further understandings of the present invention and is not to be construed as limitations thereon.

EXAMPLE 1

Doped and undoped semiconductor transport layers were formed on glass substrates. The test system was CdSe, with and without In doping (a donor for CdSe which substitutes on the cation site). Undoped CdSe quantum wires 300 were formed by a procedure analogous to that by Pradhan et al. (N. Pradhan et al., Nano Letters 6, 720 (2006)). In our version the cadmium precursor is cadmium acetate and the Se precursor is selenourea, where equal molar ($1.27 \times 10^{-4}$ moles) amounts are used in the synthesis. The coordinating solvent for the growth is octylamine (OA), which is degassed at 30° C. for 30 minutes prior to its usage. In a small vial inside of a dry box, 0.03 g of cadmium acetate is added to 4 ml OA. After gently heating this mixture under constant spinning, the solution goes clear in 5-10 minutes. Next this mixture is placed in a three-neck flask and placed on a Schlenk line. At room temperature, the contents are subjected to three cycles of evacuation, followed by argon refilling. After the third cycle, the flask contents are taken up to 120° C. To prepare the Se precursor, 0.016 g of selenourea is added to 550 μl of OA in a small vial inside of a dry box. After gentle heating and continuous stirring, the solution goes clear in ~25-30 minutes. Next the contents is transferred to a syringe and injected into the three-neck flask at 120° C. The contents of the flask turn a deep red within seconds of the injection. Under slow stirring the growth of CdSe quantum wires 300 is continued for 4-6 hours at 120° C., followed by a final 20 minute anneal at 140° C.

Figure 4:
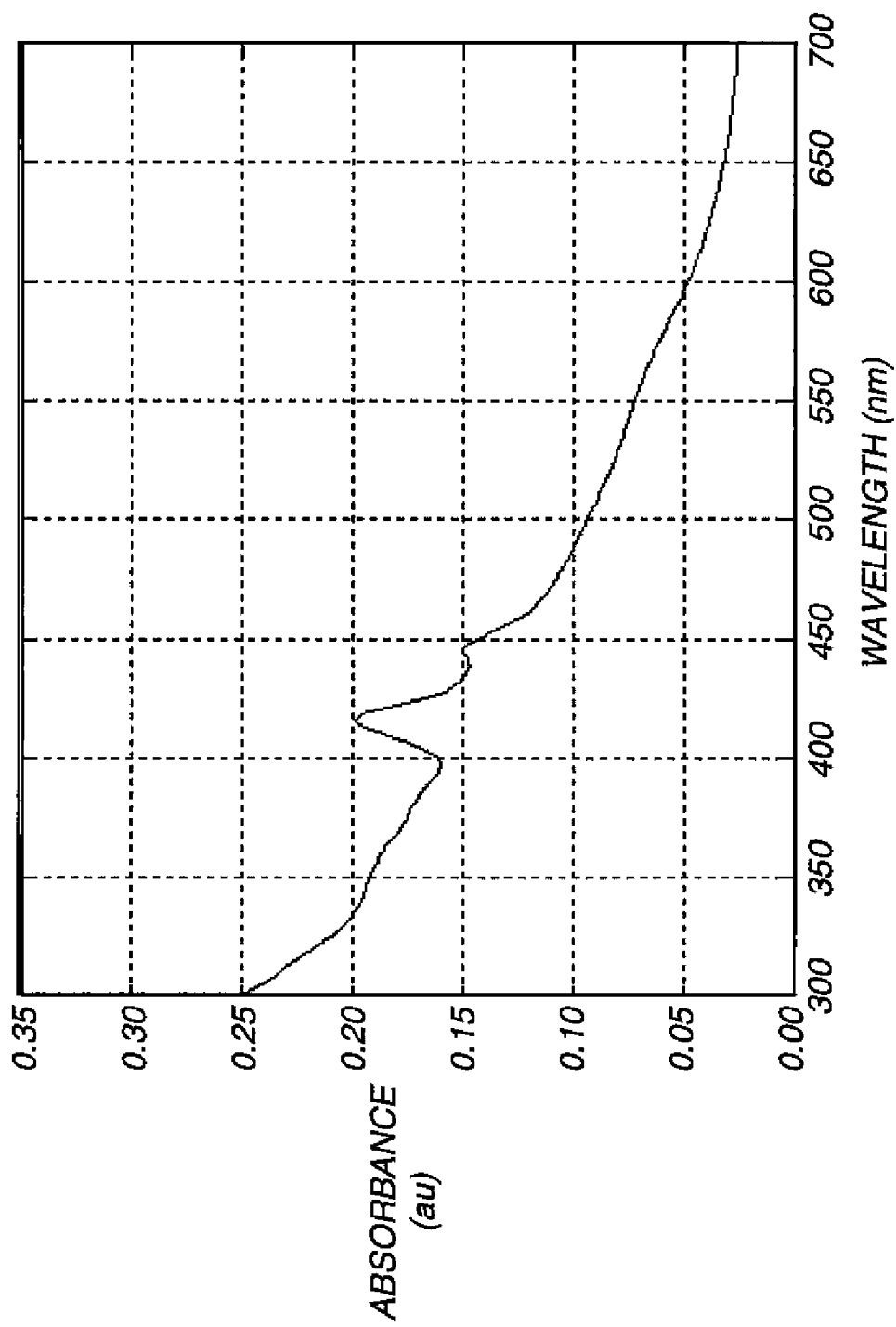
FIG. 4 shows the UV-VIS absorption spectrum of an unpurified and undoped CdSe quantum wire dispersion.
Figure 5:
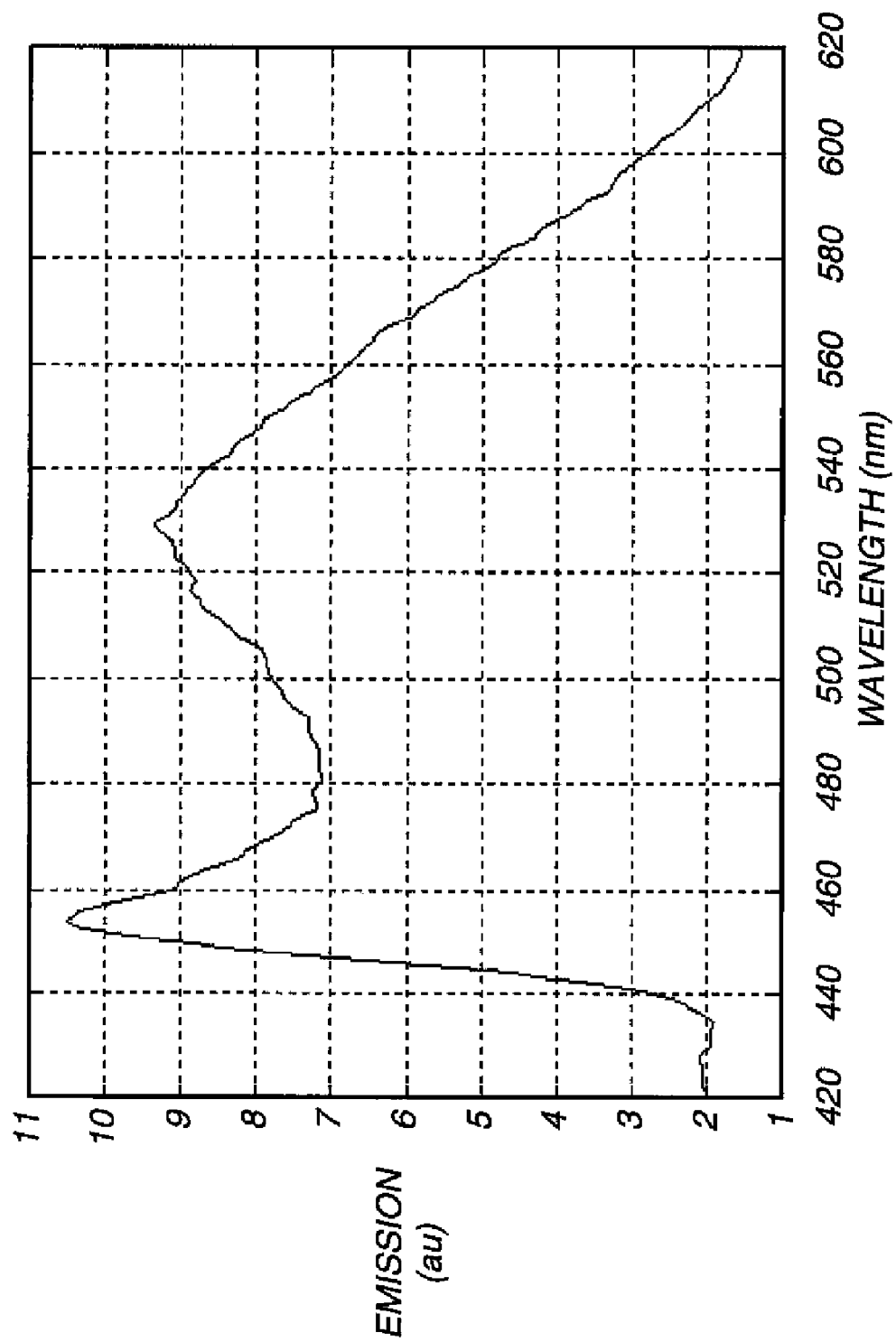
FIG. 5 shows the emission spectrum of an unpurified and undoped CdSe quantum wire dispersion with excitation at 400 nm.

Without any size selective precipitation, TEM analysis revealed the formation of CdSe prewire aggregates in addition to the CdSe quantum wires 300. The absorption spectrum of the unpurified wire solution is given in FIG. 4 that reveals a bump at 540 nm, with two sharper peaks at 446 and 416 nm. The corresponding photoluminescence response (400 nm excitation) is given in FIG. 5, which reveals two peaks, a sharp one at 450 nm (corresponding to the 416 nm absorption feature) and a much broader peak centered at 530 nm (which is probably an aggregate of the 460 nm and 540 nm absorption features). The wire emission is clearly visible in room lights, though less bright than typical CdSe quantum dots.

To form the in-situ doped semiconductor nanoparticles 305 we added indium acetate as one of the synthetic precursors. Indium acetate hydrate was added to OA in a small vial to make a $6.2\times10^{-4}$ M solution. Following gentle heating with continuous stirring, the mixture turned clear after a few minutes. Various amounts of solution were extracted from the mixture in order to get the proper doping amounts. For example, in order to have 0.1% (by molar amount) of indium precursors in the quantum wire precursor solution, 200 µl of the $6.2\times10^{-4}$ M solution was added to the three-neck flask along with the cadmium precursor solution. The remainder of the synthesis was identical to the undoped synthesis procedure. At the 0.1% doping concentration level, both the absorption and emission spectrum of the unpurified doped wires looked analogous to those reported for undoped wires in FIGS. 4 and 5, respectively.

After having formed the doped (at doping concentrations of 0.01%, 0.1%, and 1%) and undoped crude solutions, dispersions were created with alcohols as the solvents. More specifically, ~1-2 ml of crude solution was added to 3 ml of hexane, and 10 ml of methanol in a centrifuge tube. After centrifuging for a few minutes, the supernatant became clear. It was decanted off and 3-4 ml of pyridine was added. The plug quickly dissolved in the pyridine to produce a clear solution. The solution was heated at 80° C. under continuous stirring for 24 hours in order to exchange the OA organic ligands 210 for pyridine organic ligands 210. Some of the excess pyridine was then removed by a vacuum prior to adding ~15 ml of hexane to the pyridine solution. This solution was then centrifuged, the supernatant decanted, and a mixture of 1-propanol and ethanol was added to the plug in order to get a clear dispersion. Specular nanoparticle-based films were obtained upon spin coating the dispersions on clean borosilicate glass. It should be noted that the films were spin coated in air. The films were then annealed in a tube furnace (with flowing argon) at 160° C. for 30 minutes, followed by 300° C. for 45 minutes in order to boil off the pyridine ligands and to sinter the CdSe quantum wires 300, respectively. Next, ohmic contacts were deposited on the nanoparticle films through a contact mask in order to enable 2-point and 4-point probe measurements. The ohmic metals (in deposition order) consisted of 50 nm of In, 40 nm of Cr, and 350 nm of Au. Indium is a well-known ohmic contact for CdSe, while the Au was deposited in order to aid in probing the ohmic contacts. The metals were deposited by thermal evaporation under a vacuum level of ~$10^{-6}$ Torr. Prior to metal evaporation, the films were cleaned with acetone, methanol, and water, and then blown dry with nitrogen. The contacts were annealed in a tube furnace under flowing argon for 20 minutes at 240° C.

Figure 6:
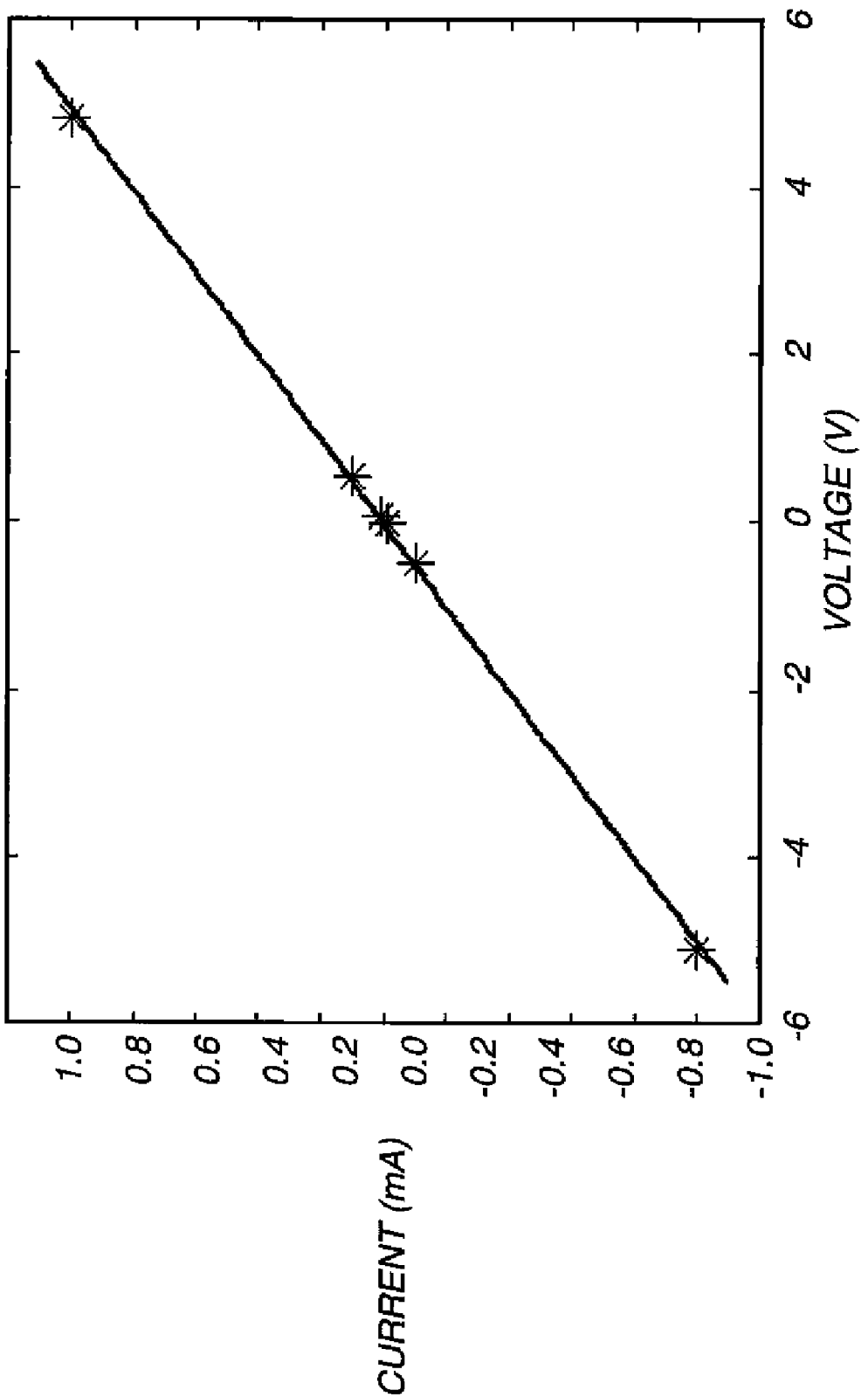
FIG. 6 shows the IV response for a two-point probe measurement of film resistance for 0.1% In doping of CdSe quantum wires.

To measure the film resistivities, a combination of a Keithley 6220 precision current source and a Keithley 6514 electrometer were used. Both 2-point and 4-point probe measurements were taken. It was determined that the metals formed ohmic contacts with the quantum wire 300 films for all of the doping concentrations (including 0%). FIG. 6 shows the IV characteristics of a two-point probe measurement made for the 0.1% doped sample. Evidence for ohmic contact formation is that the IV trace is indeed linear over a large dynamic range for positive and negative currents. Table I below shows the slope of the IV traces (R) and the corresponding film resistivity (ρ) as a function of the In doping concentration. As can be seen from the table, the film resistivity is lowest at a doping concentration of 0.1%. For the doping levels of 0 and 0.01%, the

TABLE I

| | Doping Concentration | | | |
|---|---|---|---|---|
| | 0% | 0.01% | 0.1% | 1% |
| R (GΩ) | >210 | >210 | 4 | 115 |
| ρ (ohm-cm) | >9.5 × $10^6$ | >9.5 × $10^6$ | 1.8 × $10^5$ | 5.2 × $10^6$ | measured film resistances were beyond the specifications for the electrometer (210 GΩ). As such, the resistances were recorded as >210 GΩ. For the doping level greater than 0.1% (1%), it is hypothesized that the resistivity does not continue to fall since large indium levels would begin to impact the electron mobilities through scattering events. Since the doping level of 0.1% is also large, it can be inferred that either a large number of In atoms aren't active donors or some type of self-compensation is occurring. For example, if the In dopant atoms don't lie inside of the quantum wires 300 but instead are to be found on the surface of the quantum wires 300, then as a result of spin coating the films in air these In atoms would become inactive due to becoming oxidized. By the same token, the impact of oxidation on the surface In atoms (makes them inactive) gives good support for the hypothesis that the in-situ doping did indeed produce donor In atoms for the CdSe quantum wires 300. A few experiments were also performed to determine if 300° C. was the best sintering temperature. The results were that the layer resistances were >210 GΩ, 60 GΩ and >210 GΩ for sintering temperatures of 250°, 350° and 400° C., respectively. Even though higher temperatures result in improved electron mobilities, they can also result in greater defect formation (e.g., Cd vacancy) which can produce self-compensation effects. It was also verified that the results at 0.1% doping level were reproducible; we obtained resistivity values within a factor of 1.5 of each other for the various repeats. Overall, these results show that the CdSe quantum wires 300 were doped with In donors through an in-situ doping process and that the preferred sintering temperature is in the 300° C. range.

The invention has been described in detail with particular reference to certain preferred embodiments thereof, but it will be understood that variations and modifications can be effected within the spirit and scope of the invention.

PARTS LIST 100 substrate
105 light emitting diode device
110 p-contact layer
120 p-transport layer
130 intrinsic emitter layer
140 n-transport layer
150 n-contact layer
160 anode
170 cathode
200 semiconductor core
205 inorganic nanoparticle
210 organic ligand
300 quantum wire
305 in-situ doped semiconductor nanoparticle
310 dopant atom

The invention claimed is:

1. A method of making a doped semiconductor transport layer for use in an electronic device comprising:
(a) growing in-situ doped semiconductor nanoparticles in a colloidal solution;

(b) depositing the in-situ doped semiconductor nanoparticles on a surface; and (c) annealing the deposited in-situ doped semiconductor nanoparticles so that the organic ligands boil off the surface of the in-situ doped semiconductor nanoparticles.

2. The method of claim 1 wherein the deposited in-situ doped semiconductor nanoparticles are fused by an annealing process so that a continuous doped semiconductor transport layer is formed.

3. The method of claim 1 wherein the semiconductor is selected from type IV, III-V, II-VI, or IV-VI semiconductor materials.

4. The method of claim 3 wherein the semiconductor is a type II-VI compound and the dopant atom is a group Ia, Ib, III, V, or VII material.

5. The method of claim 3 wherein the semiconductor is a type III-V compound and the dopant atom is a group IIa, IIb, IV, or VI material.

6. The method claim 3 wherein the semiconductor is a type IV material and the dopant atom is a group III or V material.

7. The method claim 3 wherein the semiconductor is a type IV-VI material and the dopant atom is a group III, V, or VII material.

8. The method of claim 1 wherein the in-situ doped semiconductor nanoparticle is either a quantum wire or a multiply connected nanoparticle that shows quantum confinement effects.

9. The method of claim 1 wherein the doped semiconductor transport layer is annealed at temperatures below 220° C.

10. The method of claim 2 wherein the doped semiconductor transport layer is annealed at temperature between 250° C. and 500° C.

11. The method of claim 10 wherein the doped semiconductor transport layer is annealed using either a tube furnace or a rapid thermal annealer.

12. A method of making a doped semiconductor transport layer for use in an electronic device comprising:

(a) growing in-situ doped semiconductor nanoparticles in a colloidal solution;

(b) performing a ligand exchange to cover the surface of the in-situ doped semiconductor nanoparticle with an organic ligand whose boiling point is below 200° C.;

(c) making a dispersion containing the ligand exchanged in-situ doped nanoparticles and an organic solvent;

(d) coating the dispersion to form an in-situ doped semiconductor nanoparticle layer; and (e) annealing the deposited in-situ doped semiconductor nanoparticle layer so that the exchanged organic ligands boil off the surface of the in-situ doped semiconductor nanoparticles.

13. The method of claim 12 wherein after step (e) the coated in-situ doped semiconductor nanoparticles are fused by an annealing process so that a continuous doped semiconductor transport layer is formed.

14. The method of claim 12 wherein the exchanged ligand is pyridine.

15. The method of claim 12 wherein the solvent is a polar.

16. The method of claim 12 wherein the dispersion is coated either by spin coating, drop casting, or inkjetting.

17. The method of claim 12 wherein the doped semiconductor transport layer is annealed at temperature below 220° C.

18. The method of claim 13 wherein the doped semiconductor transport layer is annealed at temperature between 250° C. and 500° C.

* * * * *